United States Patent
Rösner et al.

(10) Patent No.: US 6,909,141 B2
(45) Date of Patent: Jun. 21, 2005

(54) METHOD FOR PRODUCING A VERTICAL SEMICONDUCTOR TRANSISTOR COMPONENT AND VERTICAL SEMICONDUCTOR TRANSISTOR COMPONENT

(75) Inventors: Wolfgang Rösner, Ottobrunn (DE);
Thomas Schulz, München (DE);
Lothar Risch, Neubiberg (DE);
Thomas Äugle, München (DE);
Herbert Schäfer, Höhenkirchen (DE);
Martin Franosch, München (DE)

(73) Assignee: Infineon Technologies AG, Munich (DE)

( * ) Notice: Subject to any disclaimer, the term of this patent is extended or adjusted under 35 U.S.C. 154(b) by 147 days.

(21) Appl. No.: 10/047,013

(22) Filed: Jan. 16, 2002

(65) Prior Publication Data

US 2002/0121662 A1 Sep. 5, 2002

Related U.S. Application Data

(63) Continuation of application No. PCT/DE00/02316, filed on Jul. 17, 2000.

(30) Foreign Application Priority Data

Jul. 16, 1999 (DE) .......................................... 199 33 564

(51) Int. Cl.[7] .......................................... H01L 21/8238
(52) U.S. Cl. ........................ 257/329; 257/328; 257/330; 257/331; 257/327; 438/259; 438/270; 438/589; 438/212
(58) Field of Search ................................. 257/329, 302, 257/328, 327, 301, 303, 108, 51, 330, 320, 365, 337, 297, 331

(56) References Cited

U.S. PATENT DOCUMENTS

| | | | | |
|---|---|---|---|---|
| 5,554,870 A | * | 9/1996 | Fitch et al. .................. | 257/334 |
| 5,607,876 A | * | 3/1997 | Biegelsen et al. .......... | 437/129 |
| 5,714,766 A | | 2/1998 | Chen et al. | |

(Continued)

FOREIGN PATENT DOCUMENTS

| | | | |
|---|---|---|---|
| DE | 42 35 152 A1 | | 4/1994 |
| DE | 196 32 833 | * | 4/1998 |
| DE | 196 32 835 C1 | | 4/1998 |
| EP | 0 843 361 A1 | | 5/1998 |
| JP | 08 306 905 A | | 11/1996 |

OTHER PUBLICATIONS

H.I. Liu et al.: "Self-limiting oxidation for fabricating sub-5 nm silicon nanowires", Appl. Phys. Lett., vol. 64, No. 11, Mar. 14, 1994, pp. 1383–1385.

(Continued)

Primary Examiner—Nathan J. Flynn
Assistant Examiner—Frazli Erdem
(74) Attorney, Agent, or Firm—Laurence A. Greenberg; Werner H. Stemer; Ralph E. Locher

(57) ABSTRACT

A vertical semiconductor transistor component is built up on a substrate by using a statistical mask. The vertical semiconductor transistor component has vertical pillar structures statistically distributed over the substrate. The vertical pillar structures are electrically connected on a base side thereof to a first common electrical contact. The vertical pillar structures include, along the vertical direction, layer zones of differing conductivity, and have insulation layers on their circumferential walls. An electrically conductive material is deposited between the pillar structures and forms a second electrical contact of the semiconductor transistor component. The pillar structures are electrically contacted to a third common electrical contact on their capping side.

16 Claims, 5 Drawing Sheets

U.S. PATENT DOCUMENTS

| | | | |
|---|---|---|---|
| 5,871,870 A | | 2/1999 | Alwan |
| 6,013,548 A | * | 1/2000 | Burns, Jr. et al. ............ 438/242 |
| 6,060,746 A | * | 5/2000 | Bertin et al. ................. 257/331 |
| 6,077,745 A | * | 6/2000 | Burns, Jr. et al. ............ 438/270 |
| 6,134,175 A | * | 10/2000 | Forbes et al. ........... 365/230.06 |
| 6,448,601 B1 | * | 9/2002 | Forbes et al. ................ 257/302 |
| 6,498,065 B1 | * | 12/2002 | Forbes et al. ................ 438/259 |

OTHER PUBLICATIONS

Harald Gossner et al.: "Vertical Si–Metal–Oxide–Semiconductor Field Effect Transistors with Channel Lengths of 50 nm by Molecular Beam Epitaxy", Jpn. J. Appl. Phys., vol. 33, 1994, pp. 2423–2428.

Lothar Risch et al.: "Vertical MOS Transistors with 70 nm Channel Length", IEEE Transactions on Electron Devices, vol. 43, No. 9, Sep. 1996, pp. 1495–1498.

Hiroshi Fukuda et al.: "Fabrication of silicon nanopillars containing polycrystalline silicon/insulator multilayer structures", Appl. Phys. Lett., vol. 70, No. 3, Jan. 20, 1997, pp. 333–335.

Hiroshi Mizuta et al.: "High–speed single–electron memory: cell design and architecture", XP–002151823, IEEE 1998, pp. 67–72.

* cited by examiner

US 6,909,141 B2

METHOD FOR PRODUCING A VERTICAL SEMICONDUCTOR TRANSISTOR COMPONENT AND VERTICAL SEMICONDUCTOR TRANSISTOR COMPONENT

CROSS-REFERENCE TO RELATED APPLICATION

This application is a continuation of copending International Application No. PCT/DE00/02316, filed Jul. 17, 2000, which designated the United States.

BACKGROUND OF THE INVENTION

1. Field of the Invention

The invention relates to a method for producing a vertical semiconductor transistor component and to a vertical semiconductor transistor component.

The ever increasing packing density of circuits on semiconductor chips is placing ever greater demands on the process and circuit technology. Until now, planar MOS (Metal Oxide Semiconductor) components have been scaled by improvements in optical lithography systems. This results in a shortening of the channel length of the transistors which has the effect of enhancing performance. With a further reduction in the structure sizes, however, two main problems arise.

Firstly, the concept of the planar "bulk" MOSFET (Metal Oxide Semiconductor Field Effect Transistor) reaches its limit, since parasitic short-channel effects reduce the performance capability of this component. In this context, it has already been attempted to counteract the loss in performance by technologically complex channel doping profiles ("pockets" or "retrograde wells"). Further concepts currently being pursued to avoid parasitic short-channel effects include the production of transistors on SOI (Silicon-on-Insulator) wafers or the development of planar dual-gate transistors, in which improved gate control is achieved by embedding the channel region between two opposing gate electrodes.

The other problem is that the optical lithography systems are likely to reach their performance limits before long. An alternative scaling possibility is provided by the concept of vertical components (in contrast to planar components). With a vertical type of construction, channel lengths of below 100 nm can be readily achieved in the case of MOSFETs, since the channel length can be set with great accuracy by prescribing a layer thickness.

Published, Non-Prosecuted German Patent Application No. DE 196 32 835 A1 describes a semiconductor capacitor which has a capacitor electrode with vertical pillar structures to enlarge its capacitor area. The pillar structures are formed using a statistical mask, which permits structure sizes in the sub-100 nm range.

The article "Self-limiting oxidation for fabricating sub-5 nm silicon nanowires" by H. I. Liu, et al., Appl. Phys. Lett. 64 (11), pages 1383–1385 (1994), describes a lateral oxidation process, with which it is possible to produce vertical 2 nm wide silicon pillar structures which are surrounded by an $SiO_2$ sheath.

In the article "Fabrication of silicon nanopillars containing polycrystalline silicon/insulator multilayer structures", by H. Fukuda, et al., Appl. Phys. Lett. 70 (3), pages 333–335 (1997), a single-electron transistor is proposed, which includes silicon pillar structures which are produced by the lateral oxidation method described in the publication mentioned above and which, furthermore, contain a plurality of tunnel insulation layers oriented in the transverse direction with respect to the pillar axis.

In the document Patent Abstracts of Japan, vol. 1997, No. 3, JP 08306905 A, a pillar structure which is formed from a stack of semiconductor layers by a photoresist pattern is described.

In the article "Vertical MOS Transistors with 70 nm Channel Length", by L. Risch et al., IEEE Transactions on Electron Devices, vol. 43, No. 9, pages 1495–1498, (1996), a lithographically produced vertical transistor with a channel length of 70 nm is described. A further vertical transistor with a channel length of 50 nm, which is produced by a shadow mask, is specified in the publication "Vertical Si-Metal-Oxide-Semiconductor Field Effect Transistors with Channel Lengths of 50 nm by Molecular Beam Epitaxy" by H. Gossner et al., Jpn. J. Appl. Phys. vol. 33, pages 2423–2428, (1994).

A statistical mask which is produced by applying a mixture including mask particles and spacing particles to a surface and subsequently removing the spacing particles is described in U.S. Pat. No. 5,871,870.

Published European Patent Application No. EP 0 843 361 A1, U.S. Pat. No. 5,714,766 and the publication "High-speed single-electron memory: cell design and architecture", by H. Mizuta et al., IEEE Comput. Soc, pages 67–72, (1998), describe memory cells with pillar structures which are made with tunnel layers for the tunneling through of one or more electrons.

SUMMARY OF THE INVENTION

It is accordingly an object of the invention to provide a method for producing a vertical semiconductor transistor component which overcomes the above-mentioned disadvantages of the heretofore-known methods of this general type and which makes it possible to produce powerful and scalable components of this type. A further object of the invention is to provide semiconductor transistor components which are powerful, in particular have a high current driver capacity, and can be scaled.

With the foregoing and other objects in view there is provided, in accordance with the invention, a method for producing a vertical semiconductor transistor component, the method includes the steps of:

producing a series of layers on, i.e. over, a substrate such that the series of layers includes layers of different electrical conductivities;

forming a statistical mask with statistically distributed mask structures over the series of layers;

forming pillar structures from the series of layers by using the statistical mask such that the pillar structures are electrically connected with one another at bases of the pillar structures for realizing a first electrical contact;

producing insulation layers on circumferential walls of the pillar structures;

depositing an electrically conductive material between the pillar structures provided with the insulation layers such that the electrically conductive material forms a second electrical contact; and depositing an electrically conductive contact material for realizing a third electrical contact such that the electrically conductive contact material electrically contacts capping regions of the pillar structures.

Accordingly, the channel length of the vertical semiconductor transistor component according to the invention is defined by a layer-producing step, while the channel width is fixed independently of the lithography by a statistical mask or random mask. In this case, the "channel" of the vertical semiconductor transistor component is represented by a plurality of individual channels, which are formed in the pillar structures and have the same length and substantially the same width. The combination of these two principles (definition of all the individual channel lengths by a common layer-producing step and definition of the individual channel widths by a statistical mask) makes it possible to produce a short-channel FET with small individual channel widths and also makes possible a substantially complete punchthrough of the potential generated by the second electrical contact (gate) through the individual channels, whereby effective transistor control is made possible and parasitic short-channel effects are eliminated. The number of pillar structures included in the component can in this case be controlled by the mask forming process (and a following lithographic selection step) and set according to the conditions and practical requirements, in particular with regard to the desired performance characteristics of the transistor.

The series of layers is preferably built up by a selective $n^+pn^+$ or $p^+np^+$ epitaxial step. It is possible by suitable doping to compensate for moderate fluctuations in the pillar structure diameters (for example 50 nm±10 nm) and achieve the effect that the weakly doped middle layer zones (channel layer zones) of the pillar structures go over into the completely depleted state when there is a corresponding gate voltage.

In an alternative way, the series of layers may also be built up by a deposition of alternating semiconductor layers and tunnel insulation layers, the layer thickness of the tunnel insulation layers being less than 5 nm. In this way, a semiconductor transistor component based on the electrical tunnel effect is realized.

According to another mode of the invention, silicon layers are deposited as the semiconductor layers, and a lateral, self-limiting oxidation step is performed for producing silicon pillar structure cores of reduced lateral dimensions subsequent to forming the pillar structures.

In other words, if the semiconductor layers are formed of silicon, a further considerable reduction in the lateral dimensions of the silicon layer zones can be achieved after the pillar structures have been formed from the series of layers by a lateral oxidation step. The underlying principle is described in the publication cited at the beginning by H. I. Liu, et al., and leads to the result that silicon is retained only in a very thin core region (diameter approximately 2 nm) of the pillar structure, while the entire surrounding sheath region of the pillar structure is oxidized. The attainable restriction of charge carriers in all dimensions allows quantum components and single-electron components to be realized on a silicon base, the production of which requires only conventional process steps (depositing, etching and self-adjusting oxidation processes).

If a multiplicity of tunnel insulation layers are provided, MTJ (multiple tunnel junctions) can also be produced in particular.

Another mode of the method according to the invention includes the step of setting a number of the pillar structures to a desired value by using a mask selection step. The number of pillar structures is preferably set to a value between 100 and 200.

Yet another mode of the method according to the invention includes the step of producing the statistical mask by depositing, with a chemical vapor deposition process, a material on a surface disposed above the series of layers wherein the material forms seeds when deposited on the surface.

A further mode of the method according to the invention includes the step of producing the statistical mask by depositing, with a chemical vapor deposition process, a continuous layer on a surface disposed above the series of layers and by subsequently performing an annealing step for disintegrating the continuous layer into individual seeds.

With the objects of the invention in view there is also provided, a vertical semiconductor transistor component, including:

a substrate;

vertical pillar structures disposed on the substrate, the vertical pillar structures having respective base sides, circumferential wall regions, and capping sides, the vertical pillar structures being statistically distributed over the substrate;

a first common electrical contact electrically connected to the vertical pillar structures at the base sides;

the vertical pillar structures defining a vertical direction and having respective layer zones with respective different conductivities disposed along the vertical direction;

the vertical pillar structures including respective insulation layers provided at the circumferential wall regions such that the vertical pillar structures are circumferentially insulated;

an electrically conductive material deposited between the vertical pillar structures, the electrically conductive material forming a second electrical contact; and a third common electrical contact electrically connected to the vertical pillar structures at the capping sides.

According to another feature of the invention, the vertical pillar structures are statistically distributed over the substrate in accordance with a statistical mask used for forming the vertical pillar structures.

According to yet another feature of the invention, the vertical pillar structures include, as the layer zones, a $n^+pn^+$ layer series or a $p^+np^+$ layer series disposed along the vertical direction.

According to a further feature of the invention, the vertical pillar structures respectively include at least one tunnel insulation layer zone.

According to yet another feature of the invention, the vertical pillar structures include, as the layer zones, at least two silicon core layer zones and a tunnel insulation layer zone separating the at least two silicon core layer zones from one another, and the at least two silicon core layer zones have respective silicon cores provided within the at least two silicon core layer zones, the silicon cores having lateral dimensions of less than 20 nm.

According to yet another feature of the invention, between 100 and 200 of the vertical pillar structures are provided for the vertical semiconductor transistor component.

Other features which are considered as characteristic for the invention are set forth in the appended claims.

Although the invention is illustrated and described herein as embodied in a method for producing a vertical semiconductor transistor component and a vertical semiconductor transistor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
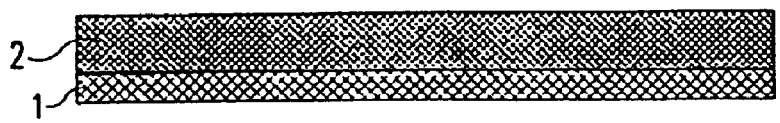
FIGS. 1A to 1I and 1K to 1P are diagrammatic sectional views of semiconductor structures for illustrating the process steps which are carried out for building up a vertical FET according to the invention in accordance with a first exemplary embodiment of the invention.

Referring now to the figures of the drawings in detail and first, particularly, to FIG. 1A thereof, there is shown a continuous conductive contact layer 2 which is produced on a substrate 2, for example a monocrystalline silicon wafer. The conductive contact layer 2 may be, for example, a doped epitaxial layer or a doped surface region of the substrate 1.

A thermal oxide layer 3, for example 700 to 800 nm thick, is subsequently grown onto the contact layer 2. An active region 4 is etched free through the use of a standard LOCOS mask L1 (LOCOS: LOCal Oxidation of Silicon), see FIG. 1B. The remaining oxide structures 3 serve for insulation with respect to neighboring transistor structures (not represented).

Figure 1B:
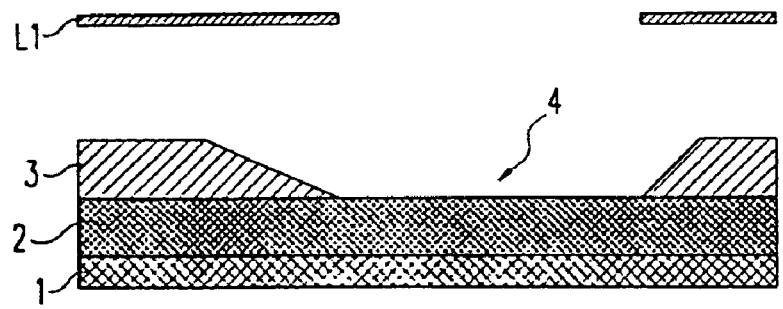

As an alternative to the LOCOS technique represented in FIG. 1B, the trench insulation technique (STI: shallow trench insulation) can also be used for the electrical insulation of neighboring transistor structures. In the case of this technique, narrow trenches are etched into the contact layer 2 and the substrate 1 and filled with an insulating material, a smaller space requirement being needed than in the case of the LOCOS insulating technique.

In a preferred selective epitaxial step (see FIG. 1C), a series of layers 5, 6, 7 is grown on in the exposed active region 4. On account of the selectivity of the epitaxial step, no mask is required for this. The layers 5, 6, 7 may be, for example, $n^+$-, p- and $n^+$-doped silicon layers or $p^+$-, n-, $p^+$-doped silicon layers. It is also possible to produce polycrystalline or possibly even amorphous doped silicon layers 5, 6, 7.

In a next step (see FIG. 1D), a capping insulation layer 8 is deposited over the series of layers 5, 6, 7 and the surrounding thermal oxide 3. The approximately 20 nm thick capping insulation layer 8 may be, for example, an $SiO_2$ layer and be deposited by the known TEOS (tetraethyl orthosilicate) method. The capping insulation layer 8 is used later as a hard-surface mask for forming the pillar structures.

Figure 1C:
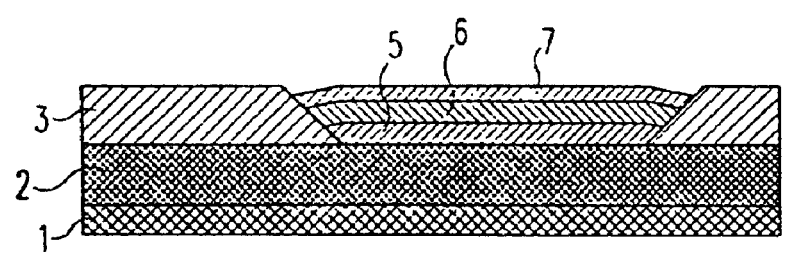
Figure 1D:
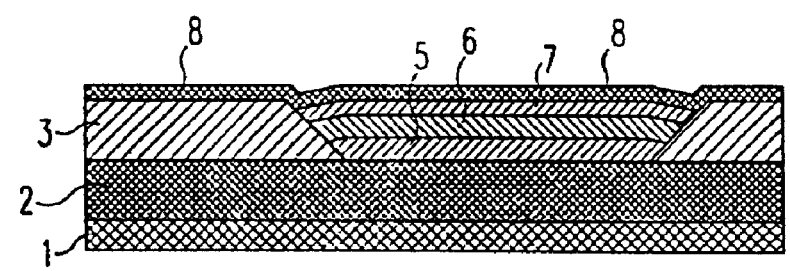
Figure 1E:
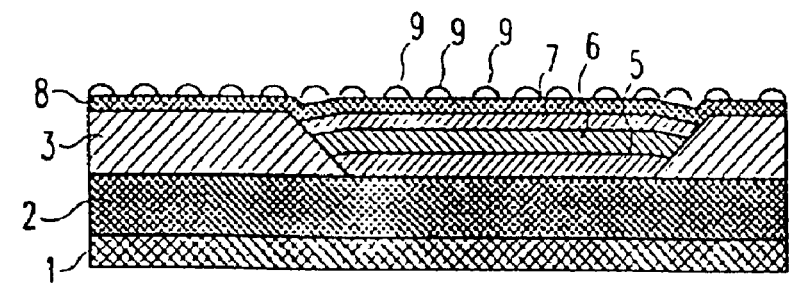

A first possible way of producing a statistical mask is described in more detail with reference to the following FIGS. 1E to 1G. Statistically distributed mask structures in the form of seeds 9 are formed on the surface of the capping insulation layer 8 during a vapor phase deposition in an epitaxial installation. An atmosphere including $H_2$ and $SiH_4$, with which $GeH_4$ is admixed to delay the nucleation process, is used as the process gas. The partial pressure of $SiH_4$ and $GeH_4$ lies in the range of $10^{-3}$ to 1 mbar, the partial pressure of $H_2$ may be approximately 1 to 100 mbar. The deposition is carried out in the temperature range between 500–700° C. Under these process conditions, individual silicon seeds are formed on the surface of the capping insulation layer 8 and determine the distribution and density of the statistically distributed mask structures. As soon as the density of the silicon seeds or nuclei has reached a predetermined value, for example approximately $10^{10}$ to $10^{12}/cm^2$, the nucleation process is discontinued.

Subsequently, the process conditions are changed in order to set specifically the size of the silicon seeds. For this purpose, process conditions such as those used for selective epitaxy are set. Further nucleation on the surface of the capping insulation layer 8 is then prevented. The selective epitaxy takes place for example with a gas mixture of $H_2$ and $SiH_2Cl_2$ in the temperature range between 600–800° C. $GeH_4$ may be added to this gas mixture, in order to set the material composition of the seeds 9.

As soon as the diameter of the seeds 9 corresponds to a predetermined value, the depositing process is discontinued. The seeds 9 form statistically distributed mask structures of a statistical mask according to FIG. 1E.

A statistical mask can also be produced in a different way. Another possible way is to apply to the capping insulation layer 8 a continuous germanium layer, which disintegrates in a subsequent annealing step (for example at 500° C.) into individual germanium seeds, which form the statistically distributed mask structures.

A third possible way is to apply to the capping insulation layer 8 a layer with a deliberately rough surface. The layer may, for example, be formed of polysilicon or polygermanium. With an average thickness of, for example, 50 nm, thickness fluctuations of the layer of 30 nm can be realized. Statistically distributed mask structures can be produced by an anisotropic etching process, by the surface of the capping insulation layer 8 being exposed earlier at locations of lesser thickness of the overlying layer with a rough surface than at locations of greater layer thickness.

According to a fourth possible method of producing a statistical mask, a first silicon layer of a thickness of 20 nm, for example, may be applied to the capping insulation layer 8, an $SiO_2$ layer of a thickness of 3 nm, for example, may be applied on top of that and a second silicon layer of a layer thickness of approximately 20 nm may be applied on top of that. In an annealing step at approximately 1000° C., the $SiO_2$ layer embedded between the silicon layers disintegrates and forms individual $SiO_2$ islands, which can be used as statistically distributed mask structures after removal of the upper silicon layer (and a structuring of the lower silicon layer occurring as this happens).

Figure 1F:
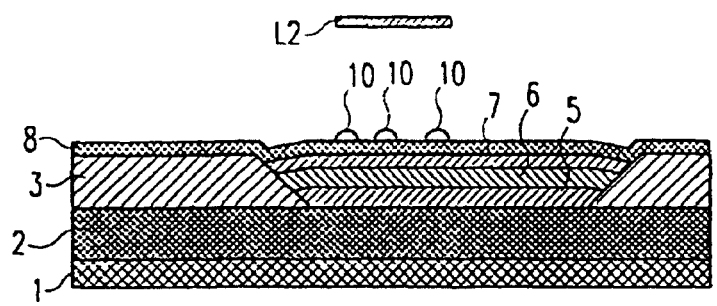
Figure 1G:
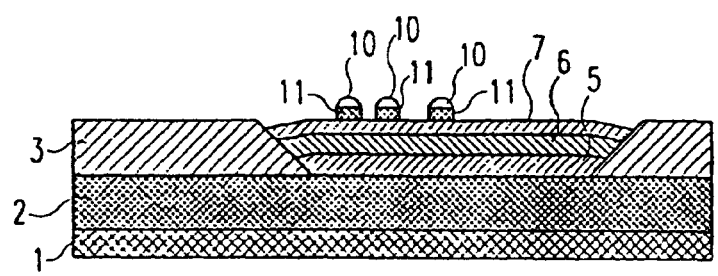

After the statistical mask has been formed, a component region is defined according to FIG. 1F through the use of a selection mask L2, by unmasked seeds 9 being etched away. Masked seeds, on the other hand, remain. The selection mask step defines both the location of the component to be formed and the number of vertical pillar structures occurring in it.

In a next process step (FIG. 1G), the capping insulation layer 8 is removed by anisotropic etching. The statistical mask of seeds 10 is transferred into the capping insulation layer 8, where it forms a hard-surface mask 11.

Figure 1H:
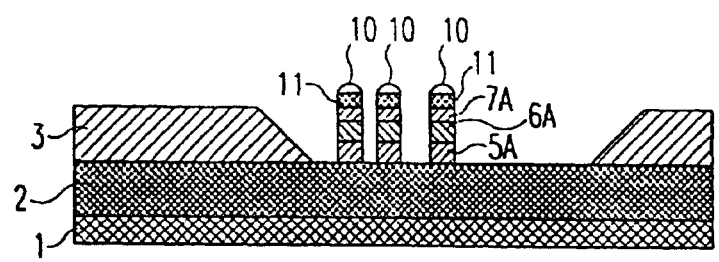
Figure 1I:
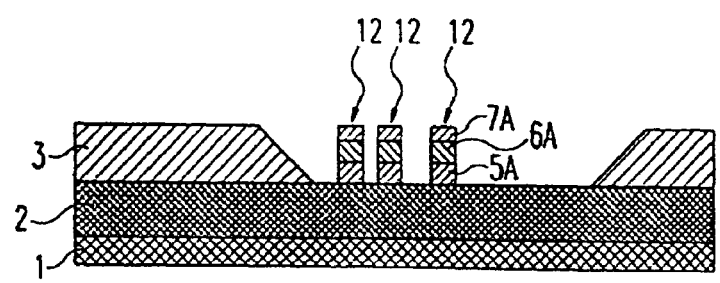

According to FIGS. 1H and 1I, after this the series of layers 5, 6, 7 is etched using the seeds 10 or the hard-surface mask 11 and then the remains of the seeds 10 and of the hard-surface mask 11 are removed. In this operation, pillar structures 12 are formed from the series of layers 5, 6, 7. The pillar structures 12 include a series of layer zones 5A, 6A and 7A according to the original series of layers 5, 6, 7.

Subsequently, a thin insulation layer 13 is produced on the exposed wall regions of the pillar structures 12 and on the surface of the contact layer 2. The insulation layer 13 may include a 3 to 5 nm thick thermal $SiO_2$ layer, which is grown on at approximately 700–800° C., and which serves at the circumference of the pillar structures 12 as a gate oxide layer of the vertical transistor component to be produced (FIG. 1K).

Figure 1K:
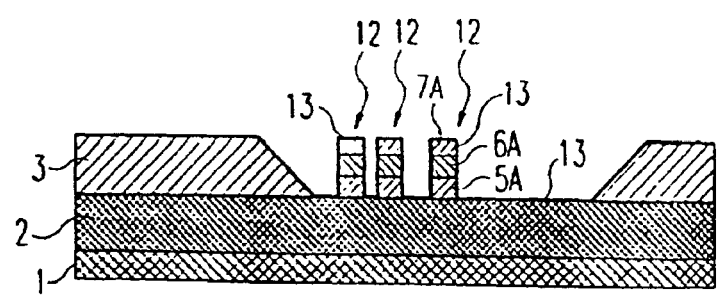
Figure 1L:
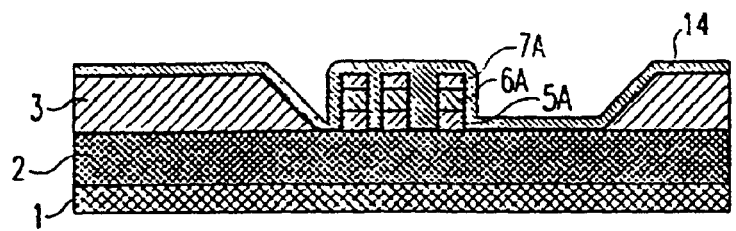

FIG. 1L illustrates the depositing of a layer 14 of in-situ-doped polysilicon ($n^+$ or $p^+$) over the structure shown in FIG. 1K. In this case, the previously existing free regions between the pillar structures 12 are filled by the polysilicon, which is called "gate filling".

Figure 1M:
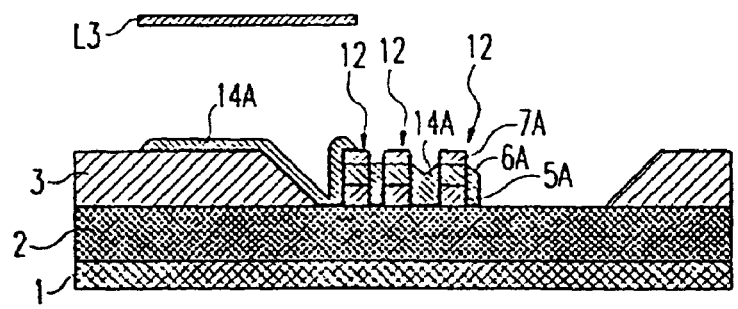
Figure 2C:
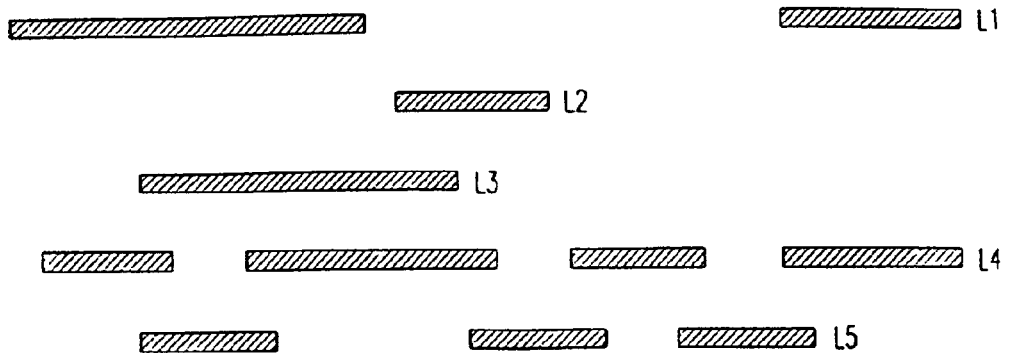
FIG. 2C is a diagrammatic sectional view illustrating the lithographic masks used for the method according to the invention, the lithographic masks shown in FIG. 2C being in alignment with the FET shown in FIGS. 2A and 2B.

In a further step, the gate electrode (second contact) of the transistor component to be produced is formed through the use of a gate definition mask L3. For this purpose, the polysilicon is etched back by a certain amount in the regions not covered by the gate definition mask L3. The gate definition mask L3 is oriented here in such a way that it at least partially covers at least some pillar structures 12 lying at the edge of the component region defined by the selection mask L2, i.e. has a certain overlap with the selection mask L2 (see also FIG. 2C). The process parameters of the etching step are set in such a way that the polysilicon layer 14 is reduced by its layer thickness, i.e. the filling height between the pillar structures 12 is reduced approximately by the layer thickness and the level polysilicon layer 14 is completely removed in unmasked regions. The polysilicon layer 14 A structured in this way is shown in FIG. 1M.

Figure 1N:
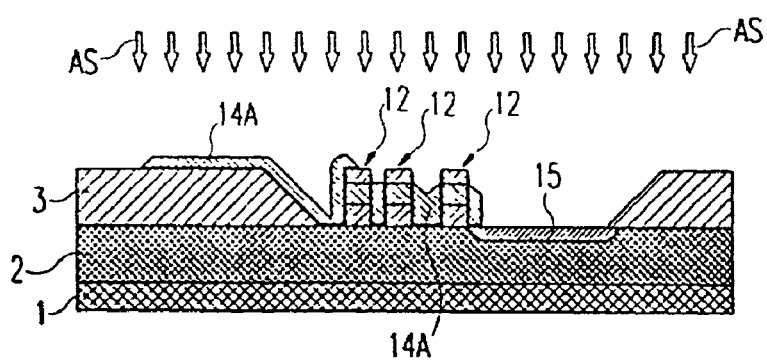

In a following optional process step, an As dopant implantation is carried out (see FIG. 1N). The As dopant implantation can take place over the entire surface area, increases the conductivity of the gate polysilicon 14 and leads into a region alongside the pillar structures 12 to the formation of an n-doped well region 15 in the contact layer 2.

Figure 1O:
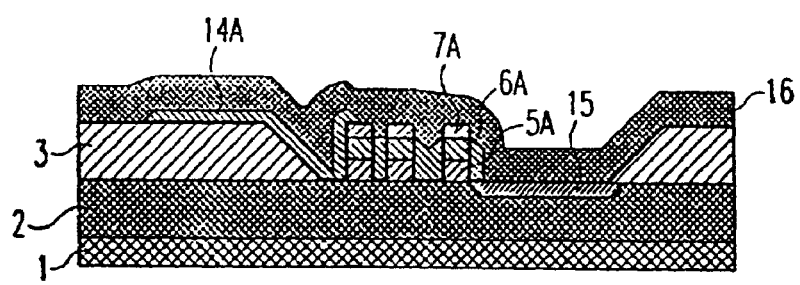

FIG. 1O shows in a cross-sectional representation the situation after the depositing of an approximately 500 nm thick intermediate oxide layer 16 and a subsequently carried-out RTA (rapid thermal annealing) step, in which the intermediate oxide layer 16 is made to flow slightly by brief heat exposure, with the effect of rounding its contour. On account of the short duration of the heat exposure, the occurrence of undesired diffusion processes can be largely prevented here.

In a further mask step, contact holes K1, K2 and K3 are introduced into the intermediate oxide layer 16 through the use of a contact hole mask L4. The contact hole L1 is located above the well region 15 and serves for the electrical contacting of the bases of the pillar structures 12. The contact hole K2 permits the electrical contacting of the polysilicon layer structure 14A. The contact hole K3 is located directly above the pillar structures 12 and permits electrical contacting of the same on the capping side.

Figure 1P:
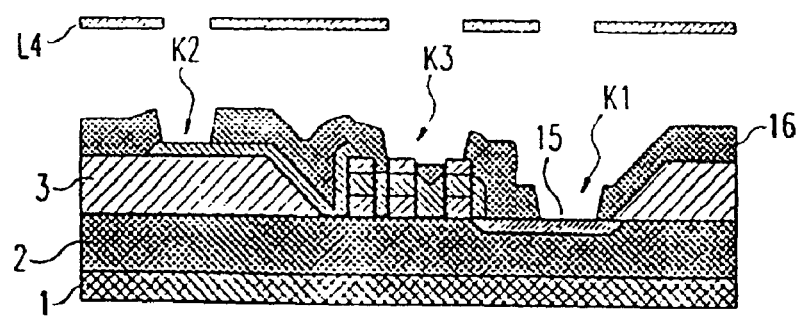

In a final process step (see FIG. 1P), a contact metal is deposited in the contacting holes K1, K2 and K3 and structured through the use of a metallization mask L5. The metal traces (see FIG. 2C) structured by the metallization mask L5 are larger than the corresponding contact hole openings of the contact hole mask L4 and cover them. FIG. 2A shows the finished vertical semiconductor transistor component. The contact material 17.1 filling the contact hole K1 realizes the source contact, the contact material 17.2 filling the contact hole K2 realizes the gate contact and the contact material 17.3 filling the contact hole K3 realizes the drain contact of the vertical MOSFET created.

Figure 2B:
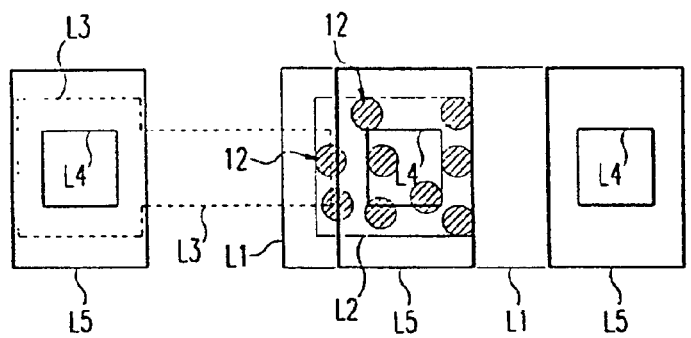
FIG. 2B is a diagrammatic plan view of the vertical FET shown in FIG. 2A, the contours of lithographic masks used in the production being depicted.
Figure 2A:
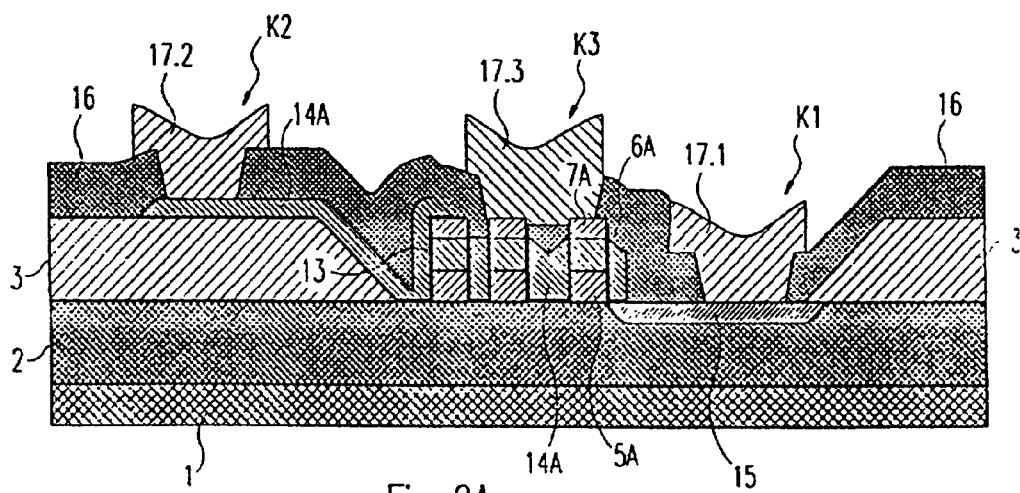
FIG. 2A is a diagrammatic sectional view of a vertical FET produced with the method according to the invention explained in FIGS. 1A to 1P.

FIG. 2B shows the processing regions defined by the masks L1 to L5 in plan view. Here, the thicknesses (diameters) of the pillar structures 12 which lie within the component region defined by the selection mask L2 have been exaggerated for illustration reasons.

The method explained has the advantage that only conventional process steps are required. It is not restricted to silicon components, but may also be used in an analogous way for SiGe, SiC and for III-V semiconductor components. On account of the flexible design with respect to the number, thickness and densities of the pillar structures 12 contained in the component, both power transistors and logic transistors can be produced. The lithography-independent depositing and etching processes taking place in conjunction with the statistical mask achieve the effect that the transistor component remains scalable in spite of structure sizes in the sub-100 nm range.

Figure 3:
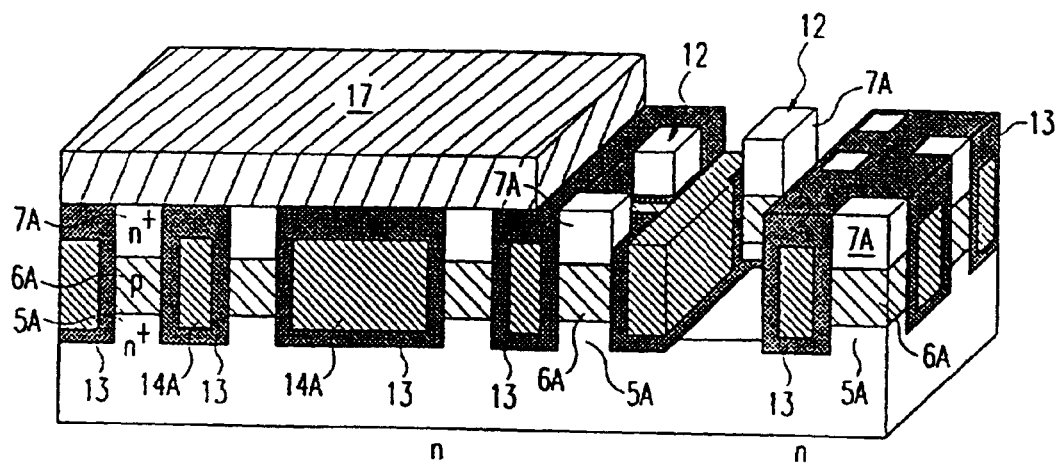
FIG. 3 is a diagrammatic perspective view of a vertical FET according to the invention.

FIG. 3 shows the MOS semiconductor transistor component represented in FIG. 2A in a partly cut-open perspective view. It is clear that the polysilicon of the gate electrode 14A surrounds the pillar structures 12 on all sides at the height of the low-doped layer zone 6A.

Figures 4A, 4B:
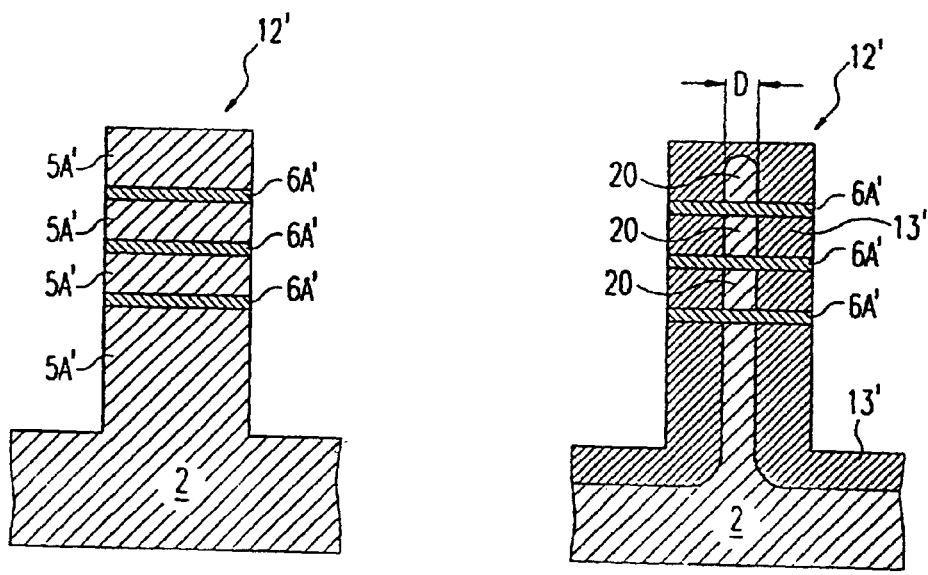
FIG. 4A is a diagrammatic sectional view of a single pillar structure to realize a single-electron or quantum FET according to the invention in accordance with a second exemplary embodiment of the invention.
FIG. 4B is a diagrammatic sectional view of the pillar structure represented in FIG. 4A after execution of a lateral self-limiting oxidation step.

By the modification to be described below, the method according to the invention also permits the production of single-electron or quantum components. The process sequence explained in FIGS. 1A to 1P is in this case initially modified to the extent that the series of layers 5, 6, 7 represented in FIG. 1C is now built up from alternately arranged silicon layers and tunnel insulation layers. FIG. 4A shows the construction of a pillar structure 12', which is then formed in a way corresponding to the previous description from the modified series of layers. Tunnel insulation layer zones are designated by 6A' and silicon layer zones are designated by 5A'. The tunnel insulation layer zones 6A' may be formed for example of $Si_3N_4$ and preferably have a layer thickness of approximately 1–2 nm. The layer thickness of the silicon layer zones 5A' (which may be formed of crystalline silicon, polysilicon or amorphous silicon) may be approximately 10 to 20 nm. The diameter of the pillar structures 12' lies for example in the range of 50 to 150 nm and consequently corresponds to the diameter of the pillar structures 12 described in FIGS. 1 to 3.

In a subsequent lateral, self-limiting oxidation step, the pillar structure 12' is oxidized in a foot and sheath region 13' by a dry oxidation process at temperatures in the range of 800 to approximately 1000° C. over a period of approximately half an hour. On the basis of a self-limiting effect, which is possibly attributable to the occurrence of lattice stress in the central pillar region, inhibiting oxygen diffusion, central silicon cores 20 remain in the silicon layer zones 5A'. The silicon cores 20 have a diameter D of only approximately 2 nm, as clearly illustrated in FIG. 4B.

Even with a layer thickness of 10 nm of the silicon layer zones 5A', a level division of the electronic states with respect to the vertical dimension is achieved. A further reduction in the layer thickness of the silicon layer zones 5A' (and consequently of the silicon cores 20) to approximately 2 nm allows single-electron components which can be operated at room temperature to be created.

The further process sequence for building up the vertical quantum component or vertical single-electron component which can be produced in this way corresponds substantially to the process steps shown in FIGS. 1L to 1P. In this case, the oxide sheath layer 13' of the pillar structures 12' can be reduced in its thickness by a suitable etching step before the polysilicon layer 14 is applied ("gate filling"), in order to achieve an even better punchthrough of the gate potential into the active silicon core 20.

Since the lateral, self-limiting oxidation step is likewise a conventional process step, the vertical-quantum or single-electron components can also be produced by using only conventional process steps.

We claim:

1. A method for producing a multi-pillar vertical semiconductor transistor, the method which comprises;

producing a series of layers on a substrate such that the series of layers includes layers of different electrical conductivities;

forming a statistical mask with statistically distributed mask structures aver the series of layers;

forming vertical pillar structures statistically distributed over the substrate from the series of layers by using the statistical mask to cause the vertical pillar structures to define a vertical direction and have respective layer zones with respective different electrical conductivities disposed along the vertical direction;

forming a first electrical contact commonly electrically connected to the vertical pillar structures at base sides of the vertical pillar structures;

producing insulation layers on circumferential wall regions of the vertical pillar structures for circumferentially insulating the vertical pillar structures;

depositing an electrically conductive material between the vertical pillar structures provided with the insulation layers such that the electrically conductive material forms a second electrical contact; and depositing an electrically conductive contact material for realizing a third electrical contact such that the electrically conductive contact material electrically contacts capping sides of the vertical pillar structures.

2. The method according to claim 1, which comprises producing the series of layers by using a selective $n^+pn^+$ epitaxial build-up process.

3. The method according to claim 1, which comprises producing the series of layers by using a selective $p^+pn^+$ epitaxial build-up process.

4. method according to claim 1, which comprises producing the series of layers by depositing alternating semiconductor layers and tunnel insulation layers such that respective layer thicknesses of the tunnel insulation layers are less than 5 nm.

5. The method according to claim 4, which comprises:

depositing silicon layers as the semiconductor layers; and performing a lateral, self-limiting oxidation step for producing silicon pillar structure cores of reduced lateral dimensions subsequent to forming the pillar structures.

6. The method according to claim 1, which comprises setting a number of the pillar structures to a desired value by using a mask selection step.

7. The method according to claim 1, which comprises setting a number of the pillar structures to a value between 100 and 200 by using a mask selection step.

8. The method according to claim 1, which comprises producing the statistical mask by depositing, with a chemical vapor deposition process, a material on a surface disposed above the series of layers wherein the material forms seeds when deposited on the surface.

9. The method according to claim 1, which comprises producing the statistical mask by depositing, with a chemical vapor deposition process, a continuous layer on a surface disposed above the series of layers and by subsequently performing an annealing step for disintegrating the continuous layer into individual seeds.

10. A multi-pillar vertical semiconductor transistor, comprising:

first, second, and third electrical contacts;

a substrate;

vertical pillar structures disposed on said substrate, said vertical pillar structures having respective base sides, circumferential wall regions, and capping sides, said vertical pillar structures being statistically distributed over said substrate;

said first electrical contact commonly electrically connected to said vertical pillar structures at said base sides;

said vertical pillar structures defining a vertical direction and having respective layer zones with respective different conductivities disposed along the vertical direction;

said vertical pillar structures including respective insulation layers provided at said circumferential wall regions such that said vertical pillar structures are circumferentially insulated;

an electrically conductive material deposited between said vertical pillar structures, said electrically conductive material forming a said second electrical contact; and said third electrical contact commonly electrically connected to said vertical pillar structures at said capping sides.

11. The vertical semiconductor transistor component according to claim 10, wherein said vertical pillar structures are statistically distributed over said substrate in accordance with a statistical mask used for forming said vertical pillar structures.

12. The vertical semiconductor transistor component according to claim 10, wherein said vertical pillar structures include, as said layer zones, a $n^+pn^+$ layer series disposed along the vertical direction.

13. The vertical semiconductor transistor component according to claim 10, wherein said vertical pillar structures include, as said layer zones, a $p^+np^+$ layer series disposed along the vertical direction.

14. The vertical semiconductor transistor component according to claim 10, wherein said vertical pillar structures respectively include at least one tunnel insulation layer zone.

15. The vertical semiconductor transistor component according to claim 10, wherein:

said vertical pillar structures include, as said layer zones, at least two silicon core layer zones and a tunnel insulation layer zone separating said at least two silicon core layer zones from one another; and said at least two silicon core layer zones have respective silicon cores provided within said at least two silicon core layer zones, said silicon cores have lateral dimensions of less than 20 nm.

16. The vertical semiconductor transistor component according to claim 10, wherein between 100 and 200 of said vertical pillar structures are provided for the vertical semiconductor transistor component.

* * * * *